United States Patent
Doster et al.

(10) Patent No.: US 6,426,857 B1
(45) Date of Patent: Jul. 30, 2002

(54) PROTECTIVE CIRCUIT FOR A POWER FIELD-EFFECT TRANSISTOR

(75) Inventors: Michael Doster, Stuttgart; Juergen Motz, Freiberg; Horst Singer, Tamm; Rolf Falliano, Rudersberg, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/411,955

(22) Filed: Oct. 4, 1999

(30) Foreign Application Priority Data

Oct. 5, 1998 (DE) .......................................... 198 45 673

(51) Int. Cl.[7] ................................................. H02H 3/26
(52) U.S. Cl. ......................................... 361/84; 307/10.7
(58) Field of Search ........................... 361/82, 84, 246, 361/245, 77, 79, 42, 111, 56, 91.6; 307/130, 131, 134, 127, 138, 10.7; 365/189

(56) References Cited

U.S. PATENT DOCUMENTS

| | | | | |
|---|---|---|---|---|
| 4,775,959 A | * | 10/1988 | Sato et al. | 365/189 |
| 5,517,379 A | * | 5/1996 | Williams | 361/84 |
| 5,539,610 A | * | 7/1996 | Williams | 361/246 |
| 5,610,793 A | * | 3/1997 | Luu | 361/111 |
| 5,936,317 A | * | 8/1999 | Sasanouchi et al. | 307/10.7 |
| 6,061,445 A | * | 5/2000 | Rahamim et al. | 379/412 |

FOREIGN PATENT DOCUMENTS

| | | |
|---|---|---|
| DE | 374 1394 | 6/1989 |
| DE | 4139378 | 6/1993 |
| DE | 195 34159 | 3/1997 |

OTHER PUBLICATIONS

IBM, Reverse Bias Over–current projection for Power Field–Effect Transistor, Jul. 1, 1986, IBM Technical Disclosure Bulletin vol. 29, pp. 567–569.*

* cited by examiner

Primary Examiner—Brian Sircus
Assistant Examiner—J. F. Duverne
(74) Attorney, Agent, or Firm—Kenyon & Kenyon

(57) ABSTRACT

In a protective circuit for a field-effect transistor which has at least drain-, source- and gate-terminals and is operated as a power switch, overloading of the FET is prevented in case of a power supply voltage of inverted polarity in that the switching voltage is able to be supplied to the gate terminal as a driving voltage via a charge pump. The charge pump is powered via a suitable circuit (e.g., a Graetz bridge rectifier) independently of the polarity of the applied power supply voltage. In case of incorrect polarity of the power supply voltage, the charge pump is driven to output a driving voltage via a suitable circuit (e.g., a diode connected to the base terminal).

13 Claims, 1 Drawing Sheet

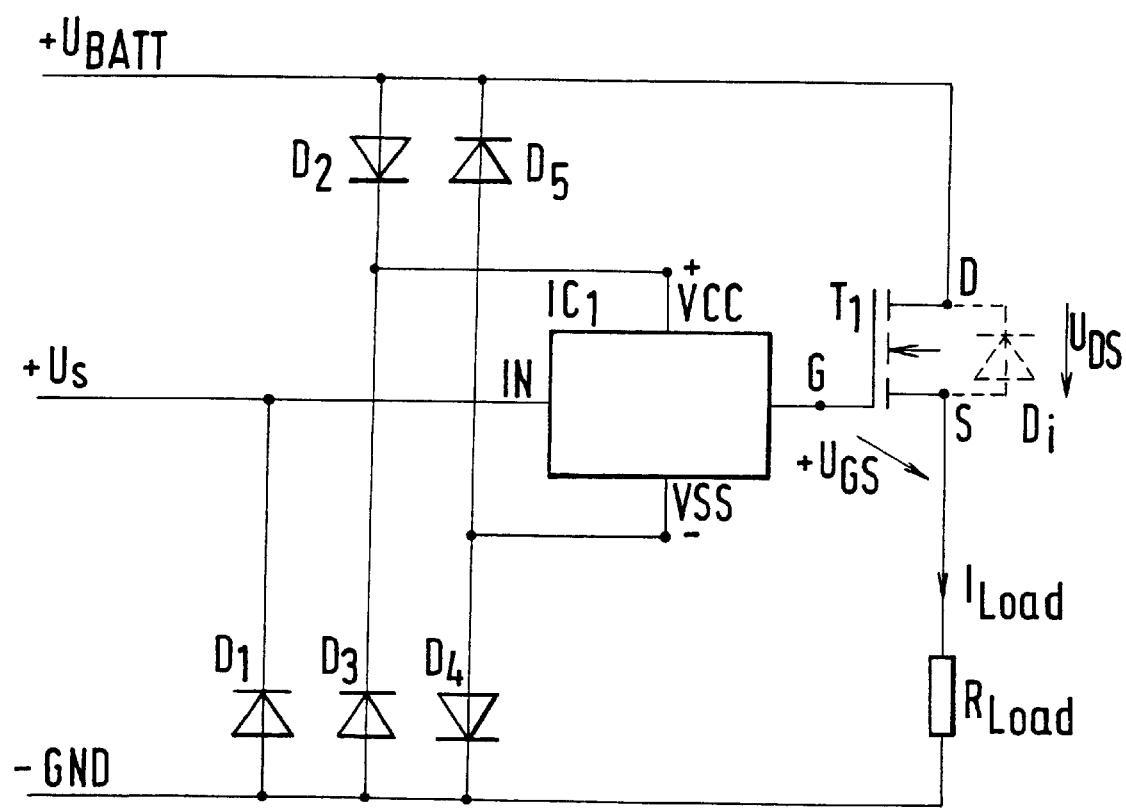

PROTECTIVE CIRCUIT FOR A POWER FIELD-EFFECT TRANSISTOR

FIELD OF THE INVENTION

The present invention relates to a protective circuit for a field-effect transistor (FET) operated as a power switch whose drain-, source- and gate-terminal are controllable.

BACKGROUND INFORMATION

In order to reduce the power dissipation in semiconductor switches, field-effect transistors, for example MOSFETs, are used; in the ON (conductive) state, these exhibit a very low resistance between source and drain. In this way it is possible to reduce measures for cooling the semiconductor switch to a minimum or omit them altogether. Thus, for example, the power dissipation can be reduced to 0.5 W for a resistance of 5 mΩ and a load current $I_{Load}$ of 10 A.

In the OFF or, respectively, ON state of the semiconductor switch, in the case of a FET, the parasitic inverse diode acting between drain and source forms a current path if the power supply voltage is connected with incorrect polarity. If load current $I_{Load}$ is limited to 10 A by load resistance $R_{Load}$ and the voltage drop across the inverse diode is 0.8 V (diode-dependent), the power dissipation increases to 8 W. This power dissipation can lead to the destruction of the FET unless there are cooling measures (e.g., heat sinks).

It is an object of the present invention to provide a protective circuit for a field-effect transistor (FET), which reliably prevents an increase in the power dissipation even when the power supply voltage has the incorrect polarity.

SUMMARY OF THE INVENTION

According to the present invention, this object is achieved in that the switching voltage is suppliable to the gate as a driving voltage via a charge pump; that the charge pump is powered via a bridge circuit independently of the polarity of the applied power supply voltage; and that, in case of incorrect polarity of the power supply voltage, the charge pump is driven to output a driving voltage via a diode connected to the base (GND).

With this protective circuit, in case of incorrect polarity of the power supply voltage, the FET is driven by the additional driving circuit via the diode and the charge pump, so that the path between the drain and the source becomes a low-resistance path. The parasitic inverse diode is practically short-circuited, and thus the power dissipation is reduced to the value corresponding to correct connection of the FET. A heat sink can therefore be dispensed with, or the measures for cooling the FET can be correspondingly reduced. Destruction of the FET is reliably prevented.

For the dual driving of the charge pump, the charge pump exhibits a control input to which the switching voltage is suppliable, and which is connected via the diode to the base, the diode being ON in case of a power supply voltage applied to the base (i.e., in case of interchanged polarity). In normal operation, the switching voltage is applied to the control input of the charge pump, while in case of incorrectly polarized power supply voltage, the control input of the charge pump is driven via the diode between base and control input by the power supply voltage incorrectly applied to the base.

The protective circuit is universally applicable if care is taken that the FET is made as an n-channel or p-channel MOSFET, the polarities of the power supply voltage, the switching voltage and the driving voltage being correspondingly interchanged and the diode being connected in the designated forward direction between the base and the control input of the charge pump.

The switching effort can be held low by using, as the charge pump, a commercial integrated circuit whose input signal and output signal are adapted to the polarity of the switching voltage. The present invention is described in greater detail on the basis of an exemplary embodiment of an n-channel MOSFET illustrated as a circuit diagram.

BRIEF DESCRIPTION OF THE DRAWING

The FIGURE shows a protective circuit according to the present invention.

DETAILED DESCRIPTION

In an n-channel MOSFET, as the + and − signs on the $U_{BATT}$ and GND terminals of the final-stage circuit indicate, power supply voltage $U_{BATT}$ is correctly connected with these polarities. Switching voltage $U_S$ turns on MOSFET $T_1$, which has its drain D connected to power supply voltage $U_{BATT}$ and its source S connected via a load resistance $R_{Load}$ to base potential GND of power supply voltage $U_{BATT}$. Gate G of MOSFET $T_1$ is controlled via a charge pump $IC_1$, known per se, which either is discretely constructed or is a commercial integrated circuit.

Switching voltage $U_S$ is supplied to control input IN of charge pump $IC_1$ and, in the present exemplary embodiment, brought to a potential that is positive relative to base potential GND, as the + sign of switching voltage $U_S$ indicates. Charge pump $IC_1$ is fed via terminals VCC and VSS, via a bridge circuit made up of diodes $D_2$ to $D_5$, independently of whether power supply voltage $U_{BATT}$ is applied to the final-stage circuit with correct or incorrect polarity. As a rule, charge pump $IC_1$ is fed via diodes $D_2$ and $D_4$, while if power supply voltage $U_{BATT}$ is of reversed polarity, charge pump $IC_1$ is fed via diodes $D_3$ and $D_5$. As a rule, when the control input is driven with positive switching voltage $U_S$, charge pump $IC_1$ supplies a positive driving voltage $U_{GS}$ to gate G of MOSFET $T_1$, which thus goes into the ON state with low resistance between drain D and source S. Load current $L_{Load}$ flows via load resistance $R_{Load}$, and a low power dissipation occurs at MOSFET $T_1$, requiring no special cooling measures for MOSFET $T_1$.

If, however, power supply voltage $U_{BATT}$ is applied to the final-stage circuit in inverted fashion, parasitic inverse diode $D_i$ would cause a load current to flow in the reverse direction, which would lead to a much higher power dissipation in MOSFET $T_1$ and could destroy the MOSFET if no measures were taken to cool the more severely loaded MOSFET $T_1$.

In order to prevent this, control input IN is connected to base GND via a diode $D_1$ in such a way that positive potential $U_{BATT}$ applied to this terminal in inverted fashion drives charge pump $IC_1$, which is now fed via diodes $D_3$ and $D_5$ and again outputs a driving voltage $U_{GS}$ of the correct polarity. In this case, MOSFET $T_1$ is reliably controlled into the ON state. This state cannot be turned off as long as the power supply voltage is of interchanged polarity. The low-resistance connection between drain D and source S short-circuits parasitic inverse diode $D_i$, so that only the small power dissipation occurs in MOSFET $T_1$ despite incorrectly polarized power supply voltage $U_{BATT}$.

Voltage drop $U_{DS}$ across parasitic inverse diode $D_i$ is reduced to the voltage drop between drain D and source S when MOSFET $T_1$ is in the ON state. Thus, even when power supply voltage $U_{BATT}$ is incorrectly applied, MOSFET $T_1$ is not overloaded and destroyed. No special measures to cool MOSFET $T_1$ are needed for this accidental case.

Naturally, the protective circuit can also be used for a p-channel MOSFET if the polarities of power supply voltage $U_{BATT}$, switching voltage $U_S$ and driving voltage $U_{GS}$ are interchanged and a charge pump $IC_1$ adapted to the new polarity of switching voltage $U_S$ and driving voltage $U_{GS}$ is used.

The exemplary embodiment shows a MOSFET $T_1$ in common drain connection; it can, however, also be operated in common source connection.

What is claimed is:

1. A protective circuit for a field-effect transistor, the field-effect transistor having a drain terminal, a source terminal and a gate terminal, the field-effect transistor operating as a power switch, comprising:

a charge pump for supplying a switching voltage to the gate terminal as a driving voltage;

a first circuit, the charge pump being fed via the first circuit independently of a polarity of an applied power supply voltage; and a second circuit for driving the charge pump to output the driving voltage in case of an incorrect polarity of the power supply voltage.

2. The protective circuit according to claim 1, wherein the first circuit includes a Graetz bridge rectifier.

3. The protective circuit according to claim 1, wherein the second circuit includes a diode connected to a base terminal.

4. The protective circuit according to claim 3, wherein the charge pump has a control input for receiving the switching voltage, the control input being coupled to the base terminal via the diode, the diode being conductive in response to the power supply voltage being applied to the base terminal.

5. The protective circuit according to claim 4, wherein the field-effect transistor is one of an n-channel MOSFET and a p-channel MOSFET, polarities of the power supply voltage, of the switching voltage and of the driving voltage being correspondingly interconnected, the diode being turned on in a designated forward conducting direction between the base terminal and the control input of the charge pump.

6. The protective circuit according to claim 1, wherein the charge pump includes one of a discretely constructed device and a commercial integrated circuit having an input signal and an output signal adapted to a polarity of the switching voltage and of the driving voltage.

7. The protective circuit according to claim 1, wherein the field-effect transistor is a MOSFET operated in one of a common drain circuit and a common source circuit.

8. The protective circuit according to claim 1, further comprising an integrated circuit including the field-effect transistor, the charge pump and a plurality of diodes.

9. The protective circuit according to claim 8, wherein the integrated circuit is an ASIC.

10. The protective circuit according to claim 1, wherein the second circuit is operable in the case of the incorrect polarity to cause a path between the source terminal and the drain terminal of the field-effect-transistor to become a low resistance path.

11. The protective circuit according to claim 1, wherein the second circuit is operable in the case of the incorrect polarity to cause a parasitic inverse diode of the field-effect-transistor to be substantially short-circuited.

12. The protective circuit according to claim 1, wherein the second circuit is operable in the case of the incorrect polarity to cause a power dissipation of the field-effect-transistor to be reduced to a value corresponding to a correct polarity of the power supply voltage.

13. The protective circuit according to claim 1, wherein the second circuit is operable in the case of the incorrect polarity to cause:

a path between the source terminal and the drain terminal of the field-effect-transistor to become a low resistance path;

a parasitic inverse diode of the field-effect-transistor to be substantially short-circuited; and a power dissipation of the field-effect-transistor to be reduced to a value corresponding to a correct polarity of the power supply voltage.

* * * * *